(12) United States Patent
Ikegami

(10) Patent No.: US 6,406,989 B1
(45) Date of Patent: Jun. 18, 2002

(54) METHOD OF FABRICATING SEMICONDUCTOR DEVICE WITH BUMP ELECTRODES

(75) Inventor: Gorou Ikegami, Shiga (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/375,637

(22) Filed: Aug. 17, 1999

Related U.S. Application Data

(62) Division of application No. 09/023,432, filed on Feb. 13, 1998.

(30) Foreign Application Priority Data

Feb. 21, 1997 (JP) ............................................. 9-037476

(51) Int. Cl.⁷ .............................................. H01L 21/44
(52) U.S. Cl. ....................... 438/612; 438/613; 438/108
(58) Field of Search ................................ 438/613, 108, 438/612; 257/737, 738, 778

(56) References Cited

U.S. PATENT DOCUMENTS 3,986,255 A * 10/1976 Mandal ......................... 29/626
5,214,308 A * 5/1993 Nishiguchi et al. ............ 23/48
5,742,100 A * 4/1998 Schroeder et al. .......... 257/780
5,821,627 A * 10/1998 Mori et al. .................. 257/781

* cited by examiner

Primary Examiner—Roy Potter
(74) Attorney, Agent, or Firm—Hutchins, Wheeler & Dittmar

(57) ABSTRACT

There is provided a semiconductor device including a semiconductor pellet having a plurality of bump electrodes on a surface thereof, a wiring board having a plurality of pad electrodes on a surface thereof, each one of the pad electrodes being engaged to an associated one of the bump electrodes when the wiring board is coupled to the semiconductor pellet, and a resin layer sandwiched between the semiconductor pellet and the wiring board for connecting them with each other therethrough, each of the bump electrodes being formed with one of a projection and a recess into which the projection is able to be fit, and each of the pad electrodes being formed with the other. For instance, the bump electrodes are formed by compressing a molten ball formed at a tip end of a gold wire onto the semiconductor pellet, and the projection is formed on the bump electrodes by cutting the gold wire so that a tip end portion of the gold wire leaves on the bump electrodes. In accordance with the above-mentioned semiconductor device, even if the resin layer was cracked to thereby weaken the engagement between the bump and pad electrodes, the electrical connection therebetween is ensured in sufficient condition.

26 Claims, 4 Drawing Sheets

METHOD OF FABRICATING SEMICONDUCTOR DEVICE WITH BUMP ELECTRODES

CROSS REFERENCE TO RELATED APPLICATIONS

This application is a divisional application of U.S. patent application Ser. No. 09/023,432 filed Feb. 13, 1998 (pending).

BACKGROUND OF THE INVENTION

1. Field of the Invention

The invention relates to a semiconductor device having a flip chip structure, a method of fabricating the same, and a wiring board used for the same.

2. Description of the Related Art

In order to fabricate electronic devices in a smaller size, electronic components have been made smaller and smaller with high performance and high integration being maintained.

A semiconductor device, one of electronic devices, is generally, entirely packaged with resin. However, in these days, a bare chip, which is a chip having no resin package, has been incorporated directly into a wiring board to thereby fabricate a semiconductor chip in a smaller size.

One of examples of a semiconductor device employing a bare chip is illustrated in FIG. 4. The illustrated semiconductor device is comprised of a semiconductor pellet 1, a wiring board 5 to be coupled to the semiconductor pellet 1, and a resin layer 8 sandwiched between the semiconductor pellet 1 and the wiring board 5 for enhancing engagement therebetween.

The semiconductor pellet 1 is comprised of a semiconductor substrate 2 including a plurality of semiconductor elements (not illustrated) which are interconnected to one another to thereby constitute an electronic circuit, an insulating film (not illustrated) formed on a principal surface of the semiconductor substrate 2, underlying electrodes 3 formed in regions where the insulating film is partially removed, and making electrical connection with the semiconductor elements, and bump electrodes 4 formed on the underlying electrodes 3. The underlying electrodes 3 are generally made of aluminum. The bump electrodes 4 are formed by deposition of gold layers by plating, evaporation and so on, or by ball-bonding method wherein a gold wire is molten at a tip end thereof to thereby form a gold ball, which is in turn collapsed on an electrode with a tip end of capillary, and then the gold wire is cut so that the collapsed gold ball leaves on the electrode.

The wiring board 5 is comprised of an insulating substrate 6 made of insulating material such as resin and ceramics, and pad electrodes 7 formed on the insulating substrate 6 in facing relation with the bump electrodes 4 formed on the semiconductor substrate 2. The pad electrodes 7 are electrically connected to an electrically conductive pattern (not illustrated) which is covered with a resist film (not illustrated) so that necessary portions are exposed outside, and which is electrically connected to other electronic components and/or external connection terminals to thereby constitute an electronic circuit. The electrically conductive pattern is formed generally by etching copper foil deposited on the insulating substrate 6. The pad electrodes 7 are plated with nickel for preventing corrosion of the copper foil, and further plated with gold for enhancing electrical connection with the electrically conductive pattern.

The semiconductor pellet 1 and the wiring board 5 are connected to each other through the resin layer 8. First, the semiconductor pellet 1 and the wiring board 5 are overlapped each other so that the bump electrodes 4 and the pad electrodes 7 are engaged to each other. Then, the semiconductor pellet 1 and the wiring board 5 are pressurized to thereby cause the bump electrodes 4 into plastic deformation. Then, resin is introduced into a space between the semiconductor pellet 1 and the wiring board 5. The semiconductor pellet 1 and the wiring board 5 are kept under pressure due to contraction of the resin layer 8 which occurs when the resin cures. The resin layer 8 may be formed on the wiring board 5 before the semiconductor pellet 1 and the wiring board 5 are overlapped each other, or may be formed by introducing resin between the semiconductor pellet 1 and the wiring board 5 after they have been overlapped each other. With the semiconductor pellet 1 and the wiring board 5 kept under pressure, the semiconductor pellet 1 or the wiring board 5 is heated at about 200° C. for a few minutes in order to facilitate the resin layer 8 to cure.

In the illustrated semiconductor device, since the semiconductor pellet 1 is naked, namely, not packaged entirely with resin, a height measured from a surface of the insulating substrate 6 to a top surface of the semiconductor pellet 1 can be kept within 100 μm, which satisfies the requirement of fabricating a semiconductor device in a smaller size.

Japanese Unexamined Patent Publication No. 5-166881 has suggested a semiconductor device similar to the above-mentioned one. In the suggested semiconductor substrate, bump electrodes are formed on a semiconductor pellet by golden ball bonding method, and pad electrodes are connected to the bump electrodes through solder having a low melting point. Namely, the semiconductor pellet is mechanically and electrically connected to a wiring board without a resin layer such as the resin layer 8 illustrated in FIG. 1.

Japanese Unexamined Patent Publication No. 7-153796 has suggested a semiconductor device including bump electrodes formed on a semiconductor substrate by golden ball bonding method, and pad electrodes formed on a wiring board so that the pad electrodes are formed with a contact hole having a reducing diameter towards an opening thereof After the bump electrode is partially inserted into the pad electrode, the bump electrode is deformed to thereby keep the bump electrode fixed in the hole.

In the above-mentioned semiconductor devices illustrated in FIG. 1 and suggested in the above-mentioned Japanese Unexamined Patent Publications, the semiconductor pellet and the wiring board thermally expands due to heat generated in the semiconductor device while the semiconductor device is in operation and/or externally transferred heat. Hence, if there is a big difference in thermal expansion coefficient between the semiconductor pellet and the wiring board, there would be generated a stress in the bump and pad electrodes having been firmly coupled to each other.

In the semiconductor device suggested in the firstly mentioned Japanese Unexamined Patent Publication, the bump and pad electrodes are firmly connected to each other by means of solder having a low melting point. Hence, if a stress generated due to a difference in thermal expansion coefficient between the semiconductor pellet and the wiring board concentrates on a contact portion of the semiconductor pellet and the wiring board, the solder might be cracked with the result of degradation of electrical contact between them.

In the semiconductor device suggested in the secondly mentioned Japanese Unexamined Patent Publication, the bump electrodes are partially inserted into a reverse-tapered contact hole of the pad electrodes, and then the bump electrodes are deformed to thereby fill the contact hole with the bump electrodes, which ensures electrically and mechanically firm connection between the semiconductor pellet and the wiring board. However, even though the bump and pad electrodes are firmly connected to each other, if a stress generated due to a difference in thermal expansion coefficient between the semiconductor pellet and the wiring board concentrates on a contact portion of the semiconductor pellet, the bump electrodes might be peeled off the semiconductor substrate. Thus, it was impossible to completely prevent degradation of electrical connection between the semiconductor pellet and the wiring board.

Thermal expansion and thermal contraction as mentioned above occur each time when a semiconductor device starts and finishes its operation. Hence, the above-mentioned problems caused by a difference in thermal expansion coefficient between a semiconductor pellet and a wiring board are serious problems in electronic devices which frequently repeats start-up and stop in operation.

To the contrary, the resin layer 8 connects an entire surface of the semiconductor pellet 1 to the wiring board 5 in the semiconductor device illustrated in FIG. 1, and accordingly, a stress caused by a difference in thermal expansion coefficient between the semiconductor pellet 1 and the wiring board 5 is scattered, resulting in that it is possible to prevent concentration of a stress to a contact portion between the bump electrodes 4 and the pad electrodes 7. In addition, since the bump electrodes 4 and the pad electrodes 7 are electrically connected to each other under pressure, even if the above-mentioned stress is generated, the bump and pad electrodes 4 and 7 are kept under pressure and contact portions of the electrodes 4 and 7 are displaced in parallel with the semiconductor substrate 2 and the insulating substrate 6, to thereby relax the stress. Thus, the electrical connection between the semiconductor pellet 1 and the wiring board 5 is not degraded.

However, the semiconductor device illustrated in FIG. 1 is accompanied with a problem that if the resin layer 8 is peeled off the substrates 2 and 6, or is cracked due to a stress generated by thermal expansion and contraction of the substrates 2 and 6, the condition where the electrodes 4 and 7 are engaged to each other under pressure, kept by the resin layer 8, is broken, and hence a compressive force between the electrodes 4 and 7 are significantly reduced, resulting in that electrical connection between the electrodes 4 and 7 becomes unstable.

SUMMARY OF THE INVENTION

It is an object of the present invention to provide a semiconductor device and a method of fabricating the same both of which are capable of keeping sufficient electrical connection between a semiconductor pellet and a wiring board, even if a resin layer for keeping the semiconductor pellet and the wiring coupled under pressure was cracked.

In one aspect, there is provided a semiconductor device including a semiconductor pellet having a plurality of bump electrodes on a surface thereof, a wiring board having a plurality of pad electrodes on a surface thereof, each one of the pad electrodes being engaged to an associated one of the bump electrodes when the wiring board is coupled to the semiconductor pellet, and a resin layer sandwiched between the semiconductor pellet and the wiring board for connecting them with each other therethrough, each of the bump electrodes being formed with one of a projection and a recess or a through-hole into which the projection is able to be fit or inserted, and each of the pad electrodes being formed with the other.

For instance, the bump electrodes may be formed by compressing a molten ball formed at a tip end of a gold wire onto the semiconductor pellet, and when the projection is formed on the bump electrodes, the projection may be formed of a tip end portion and a small length portion from the tip end portion of said gold wire both of which leave on the bump electrodes when the gold wire is cut.

The recess or through-hole has a deformed portion for enhancing engagement between the projection and the recess or through-hole. The deformed portion is formed after the projection has been fit into the recess or through-hole.

The semiconductor device may further include a reinforcement layer formed on an inner surface of the recess or through-hole. It is preferable that the reinforcement layer is made of metal harder than a material of which the bump electrodes or the pad electrodes are made, which is formed with the recess or through-hole. The reinforcement layer may be comprised of a plurality of layers, in which case, it is preferable that at least an innermost layer among the plurality of layers is made of metal harder than a material of which the bump electrodes or the pad electrodes are made, one of which is formed with the recess or through-hole.

It is preferable that the projections in all the bump or pad electrodes have a common height.

In another aspect, there is provided a method of fabricating a semiconductor device, including the steps of forming a plurality of bump electrodes on a surface of a semiconductor pellet, each one of the bump electrodes being formed with one of a projection and a recess or a through-hole into which the projection is able to fit or insert, forming a plurality of pad electrodes on a wiring board, each one of the pad electrodes being engaged to an associated one of the bump electrodes when the wiring board is coupled to the semiconductor pellet, each one of the pad electrodes being formed with the other of the projection and the recess or through-hole, coupling the semiconductor pellet and the wiring board to each other so that the projection is fit or inserted into the recess or through-hole, and forming a resin layer between the semiconductor pellet and the wiring board.

It is preferable that the above-mentioned method further includes the step of pressurizing the projection and the recess or through-hole both of which have been engaged to each other for enhancing engagement therebetween. It is also preferable that the above-mentioned method further include the step of heating the resin layer for curing the resin layer and further for thermally, axially expanding the projection, in which case, the resin layer is preferably heated at a temperature higher than a glass-transition temperature of the wiring board.

For instance, the recess or through-hole may be formed by radiating laser beams. As an alternative, the recess or through-hole may be formed by covering the bump or pad electrodes with a protection film, and radiating laser beams thereto through the protection film. It is also possible to form the recess or through-hole by etching.

The above-mentioned method may further include the step of forming a reinforcement layer on an inner surface of the recess or through-hole. The reinforcement layer is preferably made of metal harder than a material of which the bump electrodes or the pad electrodes are made, which is formed with the recess or through-hole. The reinforcement layer may be comprised of a plurality of layers, in which case, at least an innermost layer among the plurality of layers is made of the metal.

In still another aspect of the invention, there is provided a wiring board to be coupled to a semiconductor pellet with a resin layer sandwiched therebetween, the wiring board having a plurality of pad electrodes on a surface thereof, each one of the pad electrodes being engaged to an associated one of bump electrodes formed on a surface of the semiconductor pellet when the wiring board is coupled to the semiconductor pellet, each of the pad electrodes being formed with one of a recess and a through-hole into which a projection formed on each of the bump electrodes is able to be fit.

It is preferable that the recess or through-hole has a deformed portion for enhancing engagement between the projection and the recess or through-hole, the deformed portion being formed after the projection has been fit into the recess or through-hole.

In accordance with the above-mentioned semiconductor device or method, even if a resin layer for keeping a semiconductor pellet and a wiring board coupled to each other, and also for keeping bump and pad electrodes engaged to each other under pressure, was cracked to thereby weaken the engagement between the bump and pad electrodes, electrical connection therebetween is ensured in sufficient condition. Thus, a highly reliable semiconductor device is presented.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 1:
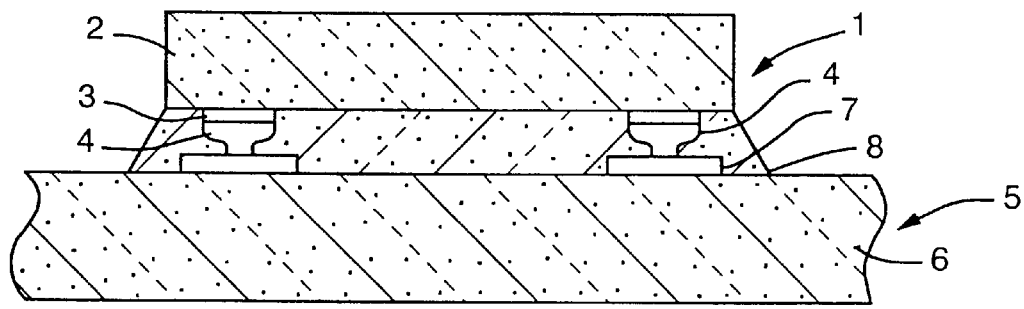
FIG. 1 is a cross-sectional view of a conventional semiconductor device.
Figure 2:
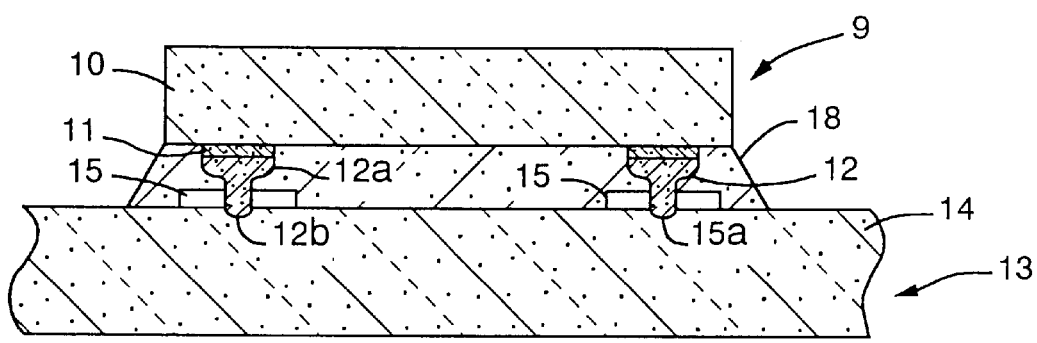
FIG. 2 is a cross-sectional view of a semiconductor device in accordance with the first embodiment of the present invention.
Figure 3:
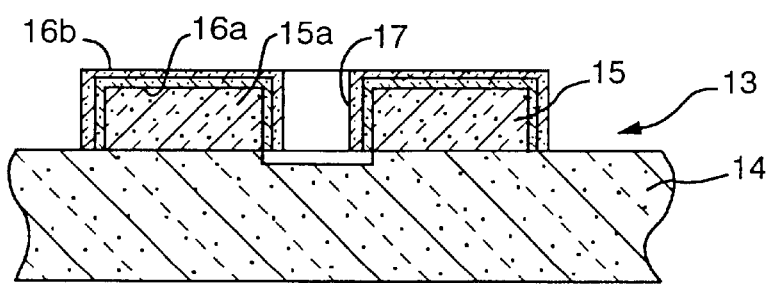
FIG. 3 is a partially enlarged cross-sectional view of a wiring board used in the semiconductor device illustrated in FIG. 2.
Figure 4:
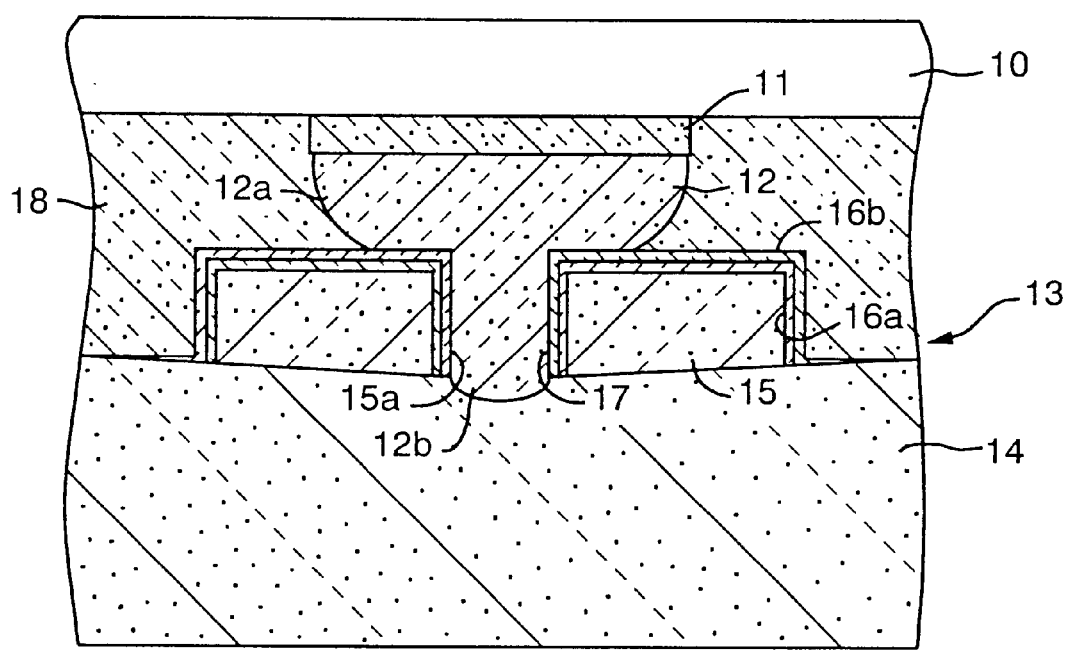
FIG. 4 is a partially enlarged cross-sectional view of the semiconductor device illustrated in FIG. 2.

FIGS. 2 to 4 illustrate a semiconductor device in accordance with the first embodiment. With reference to FIG. 2, the illustrated semiconductor device is comprised of a semiconductor pellet 9, a wiring board 13 to be coupled to the semiconductor pellet 9, and a resin layer 18 sandwiched between the semiconductor pellet 9 and the wiring board 13 for enhancing engagement therebetween.

The semiconductor pellet 9 is comprised of a semiconductor substrate including a plurality of semiconductor elements (not illustrated) which are interconnected to one another to thereby constitute an electronic circuit, an insulating film (not illustrated) formed on a principal surface of the semiconductor substrate 10, underlying electrodes 11 formed in regions where the insulating film is partially removed, and making electrical connection with the semiconductor elements, and bump electrodes 12 formed on the underlying electrodes 11. The underlying electrodes 11 are made of aluminum.

In the instant embodiment, each one of the bump electrodes 12 is comprised of a collapsed ball or an electrode body 12a and a projection 12b projecting from the collapsed ball 12a. The collapsed ball 12a and the projection 12b of the bump electrodes 12 are formed by melting a gold wire at a tip end thereof to thereby form a gold ball, compressing the thus formed gold ball onto the underlying electrodes 11 to thereby collapse the gold ball, and cutting the gold wire so that the collapsed gold ball and a small length of the gold wire extending from the collapsed gold ball leave on the underlying electrodes 11.

If the gold wire used had a diameter of 25 $\mu$m, the collapsed ball 12a would have a diameter of about 80 $\mu$m and a height of about 25 $\mu$m, and the projection 12b would be of parabolic body of revolution having a diameter of about 25 $\mu$m and a height from the underlying electrode 11 of about 70 $\mu$m.

The wiring board 13 is comprised of a multi-layered, insulating substrate 14 made of epoxy resin, and an electrically conductive pattern (not illustrated) formed on the insulating substrate 14. A part of the electrically conductive pattern is disposed in facing relation with the bump electrodes 12 to thereby constitute pad electrodes 15. The electrically conductive pattern is formed by etching a 18 $\mu$m-thick copper foil, for instance, and is covered with a resist film which is partially removed for exposing the pad electrodes 15 outside.

As illustrated in FIG. 3, each of the pad electrodes 15 is formed with a through-hole 15a throughout a depth thereof The through-hole 15a is designed to fittingly receive the projection 12b of the bump electrode 12 therein. The through-hole 15a is formed as follows. First, a copper foil is adhered onto a surface of the insulating substrate 14. Then, a first photoresist film is formed on the copper foil, and thereafter, is exposed to a light in a desired pattern. Then, a portion of the copper foil having been exposed to a light is etched for removal to thereby form a desired pattern of copper. Thereafter, the first photoresist film is removed. Then, a second photoresist film is formed on the thus patterned copper foil in such a pattern that a region in which the pad electrodes 15 are to be formed is exposed to a light. Then, the second photoresist film is exposed to a light to thereby be cured. Then, laser beams are radiated to the above-mentioned region to thereby form the through-holes 15a. The thus formed through-hole 15a has a diameter of about 30 $\mu$m and a depth of about 22 $\mu$m, and extends throughout the pad electrode 15. After the pad electrodes 15a are plated with nickel and gold layers 16a and 16b, as mentioned below, the through-hole 15a is reduced in a diameter down to about 24 $\mu$m.

As illustrated in FIG. 3, the pad electrode 15 is plated over a surface thereof including an inner surface of the through-hole 15a with an about 3 $\mu$m-thick nickel layer 16a and an about 0.05 $\mu$m-thick gold layer 16b. Since nickel is harder than copper of which the pad electrodes 15 are made, the nickel layer 16a acts as a reinforcement layer 17 for reinforcing the through-hole 15a.

Then, resin 18 is supplied into a region surrounded by the pad electrodes 15, and thereafter, the semiconductor pellet 9 is disposed in facing relation with the wiring board 13, and then the projections 12 of the bump electrodes 12 are inserted into the through-holes 15a of the pad electrodes 15. Then, the semiconductor pellet 9 and the wiring board 13 are compressed to each other for more firm engagement therebetween.

Then, the semiconductor device is heated at about 200° C. in order to cure the resin 18. As a result, the projection 12b having a parabolic body of revolution expands throughout the through-hole 15a, and the projection 12b, at a tip end thereof, penetrates the insulating substrate 14 softened by heating. An intermediate portion of the projection 12b is axially compressed to thereby expand, resulting in that the projection 12b makes close contact at an outer surface thereof with an inner surface of the through-hole 15a.

Since the inner surface of the through-hole 15a is covered with the reinforcement layer 17, the inner surface of the through-hole 15a does not follow the thermal expansion of the projection 12b. Hence, the projection 12b and the through-hole 15a are firmly coupled to each other with the collapsed ball 12a lying on the pad electrode 15 in plastic deformation condition. With this condition maintained, the resin 18 is cured. As a result, the bump electrodes 12 and the pad electrodes 15 are kept under pressure by contraction of the resin 18. Thus, there is obtained the semiconductor device illustrated in FIG. 2.

In accordance with the above-mentioned semiconductor device, the projection 12b is engaged to the through-hole 15a, and the engagement of the projection 12b to the through-hole 15a ensures more reliable electrical connection between the collapsed ball 12a and the pad electrode 15. In addition, when the semiconductor pellet 9 is heated for facilitating the resin 18 to cure, the heat is transferred to the bump electrode 12 from the semiconductor substrate 10, and is concentrated on contact portions between the electrodes 12 and 15, and also on contact portions between the projection 12b and the through-hole 15a.

A temperature at which semiconductor pellet 9 is heated is arranged so that the resin 18 is heated at a temperature higher than a glass-transition temperature of the insulating substrate 14 of the wiring board 13. Epoxy resin of which the insulating substrate 14 is made has a glass-transition temperature in the range of 120° C. to 170° C. Thus, in the instant embodiment, a temperature at which the semiconductor pellet 9 is heated is arranged at 200° C. By heating semiconductor pellet 9 at 200° C. and pressurizing the semiconductor pellet 9 for 120 seconds, the pad electrodes 15 are locally softened, resulting in that the pad electrodes 15 are sunk around the through-hole 15a by a few micrometers to 20 micrometers, and accordingly deformed as illustrated in FIG. 4.

If the semiconductor pellet 9 is heated and pressurized for a certain period of time, the pad electrodes 15 remain deformed even after it is stopped to heat and pressurize the semiconductor pellet 9. As illustrated in FIG. 4, the deformation of the pad electrodes 15 results in that an opening diameter of the through-hole 15a becomes narrower, and hence corners at the inner surface of the through-hole 15a penetrate the projection 12a. Accordingly, the projection 12b and the through-hole 15a are more firmly engaged to each other. Hence, even if the electrical connection between the bump electrodes 15 and the collapsed balls 12a, brought by compression of the semiconductor pellet 9 to the wiring board 13, was deteriorated by the resin 18 being cracked, the electrical connection between the electrodes 12 and 15 is maintained in desired condition because of the firm engagement between the projection 12b and the through-hole 15a.

Thus, the semiconductor device in accordance with the first embodiment is suitable for an electronic device where starts and stops are frequently repeated, or an electronic device to be used in an environment where a surrounding temperature much varies with the result of considerable thermal expansion and contraction of components of a semiconductor device.

The scope of the present invention is not limited to the above-mentioned embodiment. For instance, the projections 12b may be leveled, after formed by cutting a gold wire, by means of a planar plate jig to thereby uniformize a height of the projections 12b.

In addition, the bump electrodes 12 may be formed by plating or evaporation as well as ball-bonding method, in which case, the projection 12b is able to be designed to have a desired cross-section and/or a desired side silhouette. Furthermore, the through-hole 16a may be formed by etching as well as radiation of laser beams, and may be designed to have a desired cross-section in line with a cross-section of the projection 12b.

In the first embodiment, the present invention is applied to all the bump electrodes 12, however, it should be noted that the present invention may be applied only to a bump electrode and an associated pad electrode which receive a considerable stress because of thermal expansion and contraction of a semiconductor device.

A period of time for the resin 18 to cure is dependent directly on a temperature at which the resin 18 is heated. Hence, there may be used a resin which cures in a shorter period of time. As an alternative, there may be used a resin which is cured by ultra-violet ray, to thereby save a time for curing a resin. It is also possible to heat the resin 18 at a temperature higher than 200° C. in a shorter period of time.

Second Embodiment

Figure 5:
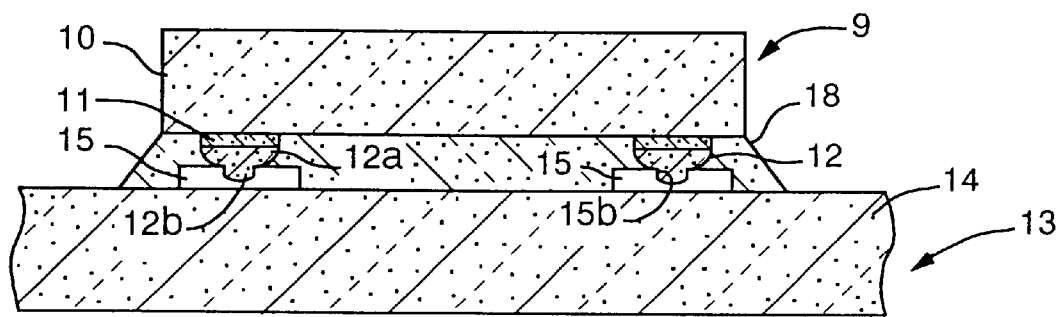
FIG. 5 is a cross-sectional view of a semiconductor device in accordance with the second embodiment of the present invention.
Figure 6:
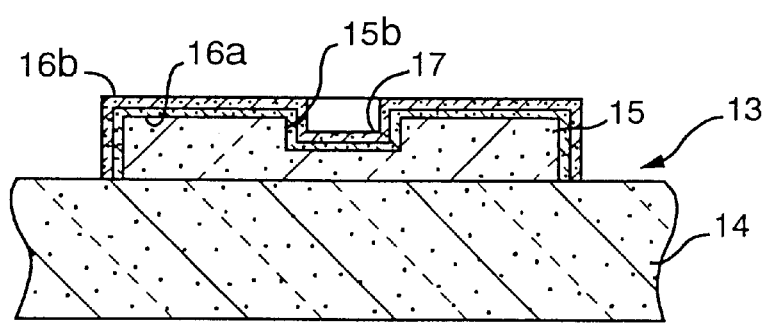
FIG. 6 is a partially enlarged cross-sectional view of a wiring board used in the semiconductor device illustrated in FIG. 5.
Figure 7:
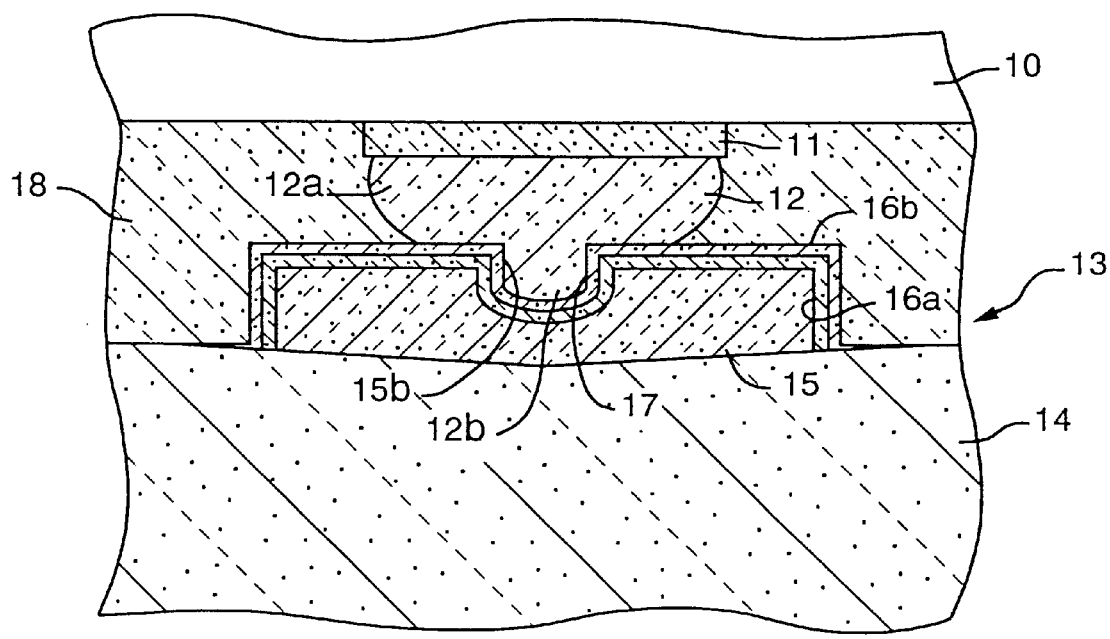
FIG. 7 is a partially enlarged cross-sectional view of the semiconductor device illustrated in FIG. 5.

FIGS. 5 to 7 illustrate a semiconductor device in accordance with the second embodiment. With reference to FIG. 5, the illustrated semiconductor device is comprised of a semiconductor pellet 9, a wiring board 13 to be coupled to the semiconductor pellet 9, and a resin layer 18 sandwiched between the semiconductor pellet 9 and the wiring board 13 for enhancing engagement therebetween.

The semiconductor device in accordance with the second embodiment is almost the same as the first embodiment illustrated in FIGS. 2 to 4, but is different from the first embodiment only in that each of the pad electrodes 15 in the second embodiment is formed with a recess 15b in place of the through-hole 15a of the first embodiment. The recess 15b is designed to have a depth smaller than a thickness of the pad electrode 15. The recess 15b provides the same advantages as those obtained by the through-hole 15a.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-37476 filed on Feb. 21, 1997 including specification, claims, drawings and summary is incorporated herein by reference in its entirety.

What is claimed is:

1. A method of fabricating a semiconductor device, comprising the steps of:
   (a) forming a plurality of bump electrodes on a surface of a semiconductor pellet, each one of said bump electrodes being formed with one of a projection and a recess into which said projection is able to fit;
   (b) forming a plurality of pad electrodes on a wiring board, each one of said pad electrodes being engaged to an associated one of said bump electrodes when said wiring board is coupled to said semiconductor pellet, each one of said pad electrodes being formed with the other of said projection and said recess;
   (c) coupling said semiconductor pellet and said wiring board to each other so that said projection is fit into said recess; and
   (d) forming a resin layer between said semiconductor pellet and said wiring board.

2. The method as set forth in claim 1, wherein said bump electrodes are formed in said step (a) by compressing a molten ball formed at a tip end of a gold wire onto said semiconductor pellet, and said projection is formed on said bump electrodes by cutting said gold wire so that a tip end portion and a small length portion from said tip end portion of said gold wire leave on said bump electrodes.

3. The method as set forth in claim 1, further comprising the step of pressurizing said projection and said recess having been engaged to each other for enhancing engagement therebetween.

4. The method as set forth in claim 1, further comprising the step of heating said resin layer for curing said resin layer and further for thermally, axially expanding said projection.

5. The method as set forth in claim 4, wherein said resin layer is heated at a temperature higher than a glass-transition temperature of said wiring board.

6. The method as set forth in claim 1, wherein said recess is formed by radiating laser beams.

7. The method as set forth in claim 1, wherein said recess is formed by covering said bump or pad electrodes with a protection film, and radiating laser beams thereto through said protection film.

8. The method as set forth in claim 1, wherein said recess is formed by etching.

9. The method as set forth in claim 1, further comprising the step of forming a reinforcement layer on an inner surface of said recess.

10. The method as set forth in claim 9, wherein said reinforcement layer is made of metal harder than a material of which said bump electrodes or said pad electrodes are made, which is formed with said recess.

11. The method as set forth in claim 9, wherein said reinforcement layer is comprised of a plurality of layers.

12. The method as set forth in claim 11, wherein at least an innermost layer among said plurality of layers is made of metal harder than a material of which said bump electrodes or said pad electrodes are made, which is formed with said recess.

13. The method as set forth in claim 1, wherein said projection is formed so that all the projections have a common height.

14. A method of fabricating a semiconductor device, comprising the steps of:
   (a) forming a plurality of bump electrodes on a surface of a semiconductor pellet, each one of said bump electrodes being formed with one of a projection and a through-hole into which said projection is able to inserted;
   (b) forming a plurality of pad electrodes on a wiring board, each one of said pad electrodes being engaged to an associated one of said bump electrodes when said wiring board is coupled to said semiconductor pellet, each one of said pad electrodes being formed with the other of said projection and said through-hole;
   (c) coupling said semiconductor pellet and said wiring board to each other so that said projection is inserted into said through-hole; and
   (d) forming a resin layer between said semiconductor pellet and said wiring board.

15. The method as set forth in claim 14, wherein said bump electrodes are formed in said step (a) by compressing a molten ball formed at a tip end of a gold wire onto said semiconductor pellet, and said projection is formed on said bump electrodes by cutting said gold wire so that a tip end portion and a small length portion from said tip end portion of said gold wire leave on said bump electrodes.

16. The method as set forth in claim 14, further comprising the step of pressurizing said projection and said through-hole having been engaged to each other for enhancing engagement therebetween.

17. The method as set forth in claim 14, further comprising the step of heating said resin layer for curing said resin layer and further for thermally, axially expanding said projection.

18. The method as set forth in claim 17, wherein said resin layer is heated at a temperature higher than a glass-transition temperature of said wiring board.

19. The method as set forth in claim 14, wherein said through-hole is formed by radiating laser beams.

20. The method as set forth in claim 14, wherein said through-hole is formed by covering said bump or pad electrodes with a protection film, and radiating laser beams thereto through said protection film.

21. The method as set forth in claim 14, wherein said through-hole is formed by etching.

22. The method as set forth in claim 14, further comprising the step of forming a reinforcement layer on an inner surface of said through-hole.

23. The method as set forth in claim 22, wherein said reinforcement layer is made of metal harder than a material of which said bump electrodes or said pad electrodes are made, which is formed with said through-hole.

24. The method as set forth in claim 22, wherein said reinforcement layer is comprised of a plurality of layers.

25. The method as set forth in claim 24, wherein at least an innermost layer among said plurality of layers is made of metal harder than a material of which said bump electrodes or said pad electrodes are made, which is formed with said through-hole.

26. The method as set forth in claim 14, wherein said projection is formed so that all the projections have a common height.

* * * * *